US008063390B2

(12) United States Patent
Larson

(10) Patent No.: US 8,063,390 B2
(45) Date of Patent: Nov. 22, 2011

(54) ELECTRON COOLING SYSTEM AND METHOD FOR INCREASING THE PHASE SPACE INTENSITY AND OVERALL INTENSITY OF ION BEAMS IN MULTIPLE OVERLAP REGIONS

(76) Inventor: Delbert J. Larson, Waxahachie, TX (US)

( * ) Notice: Subject to any disclaimer, the term of this patent is extended or adjusted under 35 U.S.C. 154(b) by 140 days.

(21) Appl. No.: 12/716,477

(22) Filed: Mar. 3, 2010

(65) Prior Publication Data

US 2011/0215236 A1 Sep. 8, 2011

(51) Int. Cl.
*H01J 49/20* (2006.01)
(52) U.S. Cl. ............... 250/492.3; 250/298; 250/489; 250/251; 315/14; 315/500; 315/505
(58) Field of Classification Search .......... 250/251, 250/281, 282, 298, 423 R, 490, 492.3; 315/14, 315/500, 501, 505, 507
See application file for complete search history.

(56) References Cited

U.S. PATENT DOCUMENTS

| | | | | |
|---|---|---|---|---|
| 4,361,761 | A * | 11/1982 | Treglio | 250/251 |
| 5,138,271 | A * | 8/1992 | Ikegami | 315/501 |
| 5,854,531 | A * | 12/1998 | Young et al. | 313/362.1 |
| 7,501,640 | B2 * | 3/2009 | Larson | 250/489 |
| 2002/0100870 | A1 * | 8/2002 | Whitehouse et al. | 250/281 |
| 2008/0203923 | A1 * | 8/2008 | Larson | 315/5.15 |
| 2008/0205573 | A1 * | 8/2008 | Larson | 376/107 |
| 2011/0158369 | A1 * | 6/2011 | Larson | 376/107 |
| 2011/0215720 | A1 * | 9/2011 | Larson | 315/14 |

* cited by examiner

*Primary Examiner* — Bernard E Souw

(57) ABSTRACT

An electron cooling system and method for increasing the phase space intensity and overall intensity of ion beams in multiple overlap regions, including a vacuum chamber to allow a single electron beam to be merged and separated with multiple ion beams, an electron supply device including a cathode to generate the electron beam, an electron collector device including a collection plate to collect the electron beam, multiple magnetic field generation devices to guide the electrons on their desired trajectories, and multiple electrodes to set the velocity of the electron beam independently in each overlap region. By overlapping the electron and ion beams, thermal energy is transferred from the ion beams to the electron beam, which allows an increase in the phase space density and overall density of the ion beams. Advantageously, the electron cooling system uses multiple magnetic field generation devices to guide the electrons into and out of multiple, separate, ion beam overlap regions, allowing the single electron beam to cool an ion beam in more than one overlap region. Advantageously, the electron cooling system uses electrodes to control the mean electron beam velocity in each overlap region, allowing for mitigation of electron beam emittance growth caused by scattering that occurs exterior to the overlap regions. Advantageously, the electrodes used to control the mean electron beam velocity in each overlap region allow for a single electron beam to achieve different velocities to match different desired ion beam velocities in the multiple overlap regions.

16 Claims, 14 Drawing Sheets ns, isotopes, or photons are used in numerous applications. Neutron applications include boron neutron capture therapy, neutron radiography, and particularly, neutron irradiation for explosive detection, contraband detection, corrosion detection, and other types of non-destructive analysis. Isotope applications include positron emission tomography (PET). Photon (or gamma ray) applications include photonuclear interrogation which has been proposed as another means of detecting contraband and explosives. Photonuclear interrogation is also used for medical imaging and other nondestructive analysis of a wide range of materials.

ELECTRON COOLING SYSTEM AND METHOD FOR INCREASING THE PHASE SPACE INTENSITY AND OVERALL INTENSITY OF ION BEAMS IN MULTIPLE OVERLAP REGIONS

REFERENCES CITED [REFERENCED BY]

U.S. Patent Documents
U.S. Pat. No. 7,501,640 March 2009 Larson
U.S. Pat. No. 5,854,531 December 1999 Young, et al.
U.S. Pat. No. 5,138,271 August 1992 Ikegami
U.S. Pat. No. 5,001,438 March 1991 Miyata et al.
U.S. Pat. No. 4,867,939 September 1989 Deutch
Other Documents
G. I. Budker, The 1966 Proc. Int. Symp. Electron and Positron Storage Rings, Saclay. Atomnaya Energiya vol. 22 p. 346, 1967.
L. Spitzer, "Physics of Fully Ionized Gases", (New York: Interscience, 1956) pp. 80-81.
G. I. Budker, et al., Particle Accelerators, Vol. 7, 197-211 (1976).
M. Bell, et al., Physics Letters, Vol. 87B, No. 3, (1979).
T. Ellison, et al., IEEE Trans. Nuc. Sci., Vol. NS-30, No. 4, 2636-2638, (1983).
D. J. Larson, et al., "Operation of a prototype intermediate-energy electron cooler", NIM, A311, 30-33 (1992).
K. Halbach and R. F. Holsinger, "SUPERFISH—A Computer Program for Evaluation of RF Cavities with Cylindrical Symmetry", Particle Accelerators 7, 213-222, (1976).

FIELD OF THE INVENTION

The present invention relates to particle beam physics devices, more particularly, to a method and system of increasing the phase space intensity and overall intensity of ion beams by overlapping a properly formed electron beam on ion beams in more than one overlap region.

BACKGROUND OF THE INVENTION

Electron cooling was originally proposed by Budker in 1966. The basis for his proposal came from work done by Spitzer (1956) who showed that warm ions come to equilibrium with cooler electrons in a plasma. Due to the much larger mass of the ion, the final rms speed of the ions is much less than that of the electrons. Budker realized that an electron beam is simply a moving electron plasma. By superimposing an ion beam on a co-moving electron beam, warmer ions are cooled by the electron beam.

In the 1970's electron cooling was demonstrated to be an extremely good way of increasing the phase space density and stored lifetime of proton beams. Cooling times of between one and ten seconds were reported by experiments at Novosibirsk, CERN, and Fermilab. An experiment completed in Middleton, Wis. culminated in the construction of an electron cooler capable of cooling intermediate energy (about 5 GeV) antiproton beams.

Uses of high intensity, low energy ion beams may include the production of energy through fusion interactions. Several nuclear reactions are known to produce much more energy than the energy required to initiate the interaction, and the initiation energy is very low by particle beam standards.

Uses of high intensity, low energy ion beams may also include the generation of photons, neutrons and a variety of nuclear isotopes, with improved efficiency and yield. Neutrons, isotopes, or photons are used in numerous applications. Neutron applications include boron neutron capture therapy, neutron radiography, and particularly, neutron irradiation for explosive detection, contraband detection, corrosion detection, and other types of non-destructive analysis. Isotope applications include positron emission tomography (PET). Photon (or gamma ray) applications include photonuclear interrogation which has been proposed as another means of detecting contraband and explosives. Photonuclear interrogation is also used for medical imaging and other nondestructive analysis of a wide range of materials.

Conventional techniques involve an electron supply device including a cathode to supply electrons, and including electrodes biased positively with respect to the cathode and arranged so as to accelerate the electrons so that they have the same velocity as the ions. Conventional techniques (see U.S. Pat. No. 7,501,640 incorporated by reference in its entirety) also involve a reverse biasing of electrodes within the electron supply device to serve as a first end of a longitudinal trap for background-ions.

Conventional techniques involve an electron collection device including a collection plate, and including electrodes biased negatively with respect to the collection plate and arranged so as to accelerate the electrons into the collection plate, thereby suppressing secondary emission from the collection plate. Conventional techniques (see U.S. Pat. No. 7,501,640) also involve a reverse biasing of electrodes within the electron collection device to serve as a second end of a longitudinal trap for background-ions.

Typically, the last downstream electrode of the electron supply device is at the potential of the surrounding vacuum pipe (which is typically ground potential) and the electron beam drifts at the potential of the vacuum pipe through a single overlap region and into the electron collection device. For low velocity electron cooling applications, the conventional technique results in a long path of travel with the electrons at low velocity which leads to multiple-scattering-induced transverse-velocity-spread increase.

Conventional techniques in electron cooling use a single electron beam and superimpose that electron beam onto a single ion beam in a single overlap region. Particle collisions between the two beams result in ion beam imperfections being transferred to the electron beam. The electron beam is then separated from the ion beam, and the electron beam is then collected in an electron collection device. Typically, solenoidal and torroidal magnetic field production devices are used to guide the electron beam onto the single ion beam, and then into the electron collection device. However, the conventional technique is costly for applications that require cooling of ions in multiple overlap regions. Conventional electron cooling systems require a separate electron beam and its associated production, transport and collection apparatus for each overlap region.

Accordingly, there is a need for an improved method and system for using a single electron beam to provide ion beam cooling in multiple overlap regions.

SUMMARY OF THE INVENTION

The present invention, which addresses the above desires and provides various advantages, resides in a method and system for using a single electron beam to increase ion beam phase space density in more than one overlap region. The system uses a vacuum chamber to reduce the amount of background gas to a very low level so as not to impede electron beam and ion beam transport. The system includes an electron cathode source, electrodes to accelerate the electron beam away from the cathode, electrodes to decelerate the electron beam and to provide longitudinal trapping for space charge neutralizing background-ions, solenoidal and torroidal magnetic field devices to guide the electron beam into and out of more than one co-moving ion beam overlap region, electrodes in the ion overlap regions to adjust the electron beam velocity to match the desired ion beam velocity, downstream electrodes to accelerate the electrons and to provide longitudinal trapping for space charge neutralizing background-ions, downstream electrodes to decelerate the electron beam, and an electrode that is a collection plate to accelerate and collect the electrons after the cooling is completed. The electron velocity is adjusted by an electrode proximate to each overlap region so that the electrons have a predetermined amount of energy to cause the ions in each overlap region to move at an ideal velocity. By traveling and interacting with the ion beam, the electron beam maintains the ion beam within parameters that optimizes end-product production. Any heating, scattering and even deceleration that would otherwise adversely affect the ions in the ion beam is effectively compensated for by the electron beam. Accordingly, scattering and energy loss in the ion beam is substantially continuously compensated for before significant instabilities have an opportunity to develop. In this manner, events that would typically cause significant instabilities in the ion beam are minimized if not eliminated.

The present invention may employ an electron beam transport region between separate ion beam overlap regions, allowing a single electron beam to increase the phase space density of ion beams in more than one overlap region, rather than simply collecting the electron beam after it has overlapped and cooled a single ion beam in a single region. This allows for multiple ion beams to be cooled by a single electron beam. This also allows for a single ion beam to be cooled by a single electron beam in more than one overlap region.

Electrodes placed within the electron beam transport region can be biased at distinct potentials at different locations, allowing for independent electron beam velocity control in different regions. This allows for higher electron beam velocities in regions where the electron beam does not overlap an ion beam, reducing the amount of deleterious scattering that the electron beam experiences in those regions. This also allows for independent control over the mean electron velocity in each overlap region, allowing for maximal effectiveness of the correction of ion beam errors in each overlap region.

By using one electron beam to increase the phase space density of ions in more than one ion overlap region, the overall energy efficiency of the cooling process will be greatly enhanced by the present invention, reducing the operating cost of electron cooled devices. Also, since construction of electron guns and collectors is far more costly than construction of solenoidal and torroidal magnetic field devices, the present invention will greatly reduce the capital cost of electron cooled devices. Hence, the present invention will reduce both the operating and capital equipment costs associated with improvement in the yields of photons, neutrons, nuclear isotopes and fusion energy produced by electron-cooled ion beams.

Other features and advantages of the present invention will become apparent from the following detailed description of the preferred embodiments, taken in conjunction with the accompanying drawings, which illustrate by way of example the principles of the invention.

BRIEF DESCRIPTION OF THE DRAWINGS

The invention is explained in more detail below with reference to the accompanying drawings in which.

DESCRIPTION OF THE PREFERRED EMBODIMENTS

Figure 1:
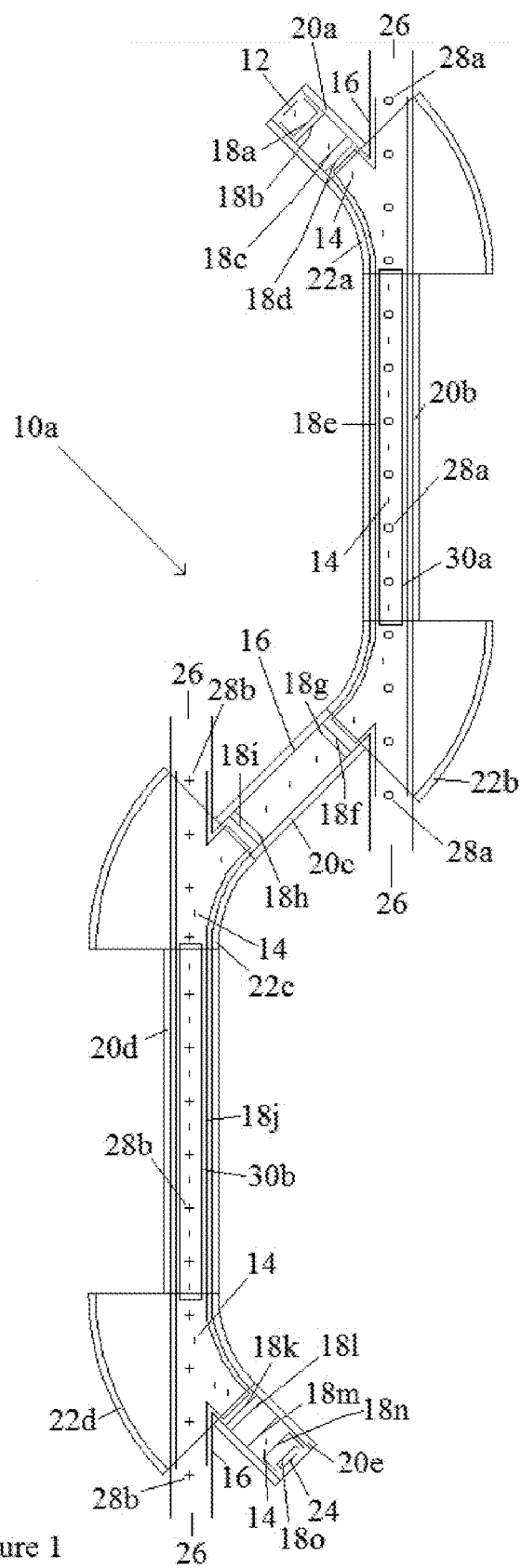
FIG. 1 is a schematic view of a first alternative system for use in the invention.
Figure 2:
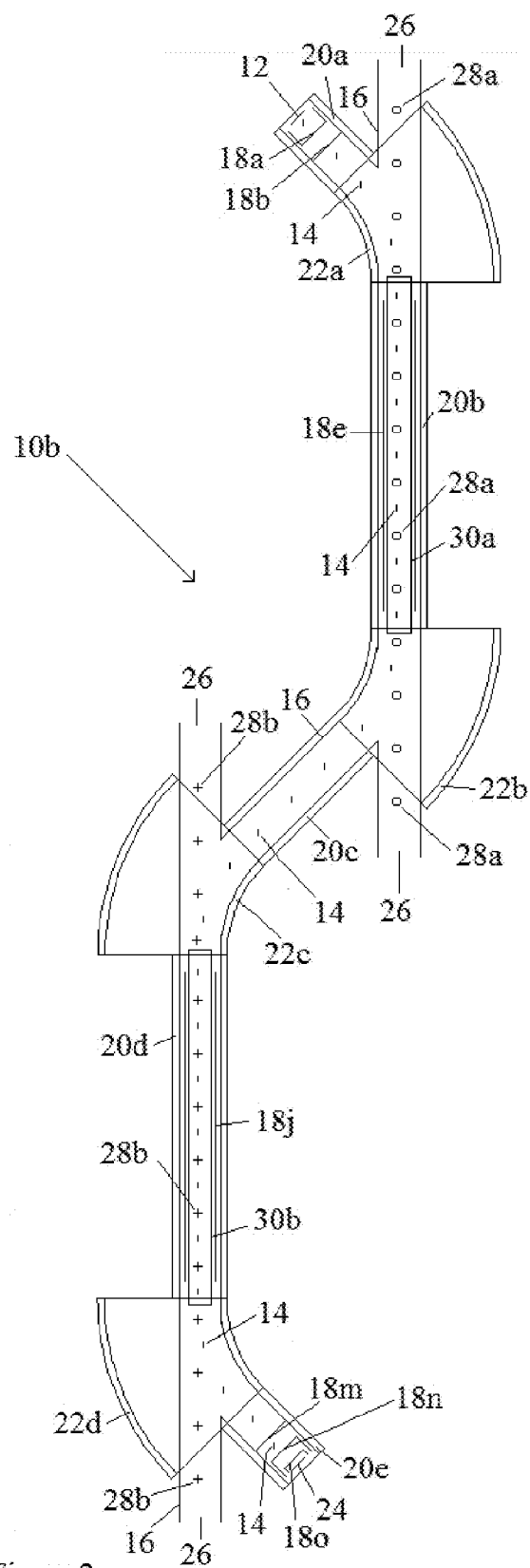
FIG. 2 is a schematic view of a second alternative system for use in the invention.
Figure 3:
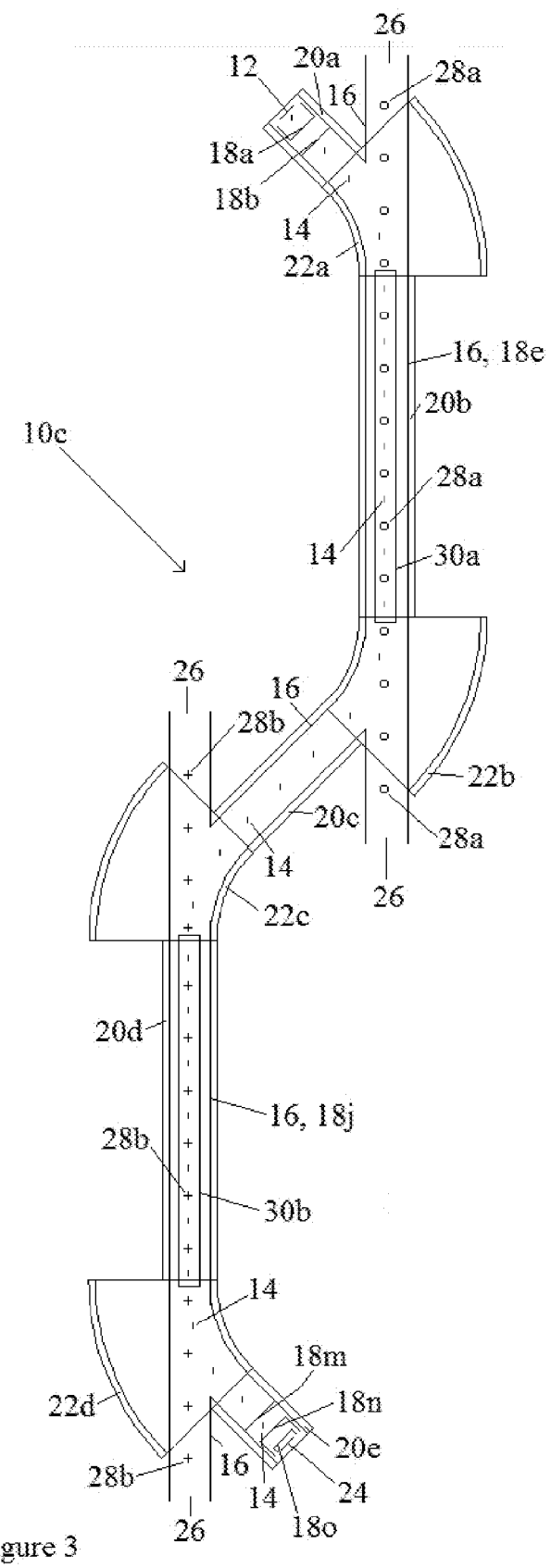
FIG. 3 is a schematic view of a third alternative system for use in the invention.
Figure 13:
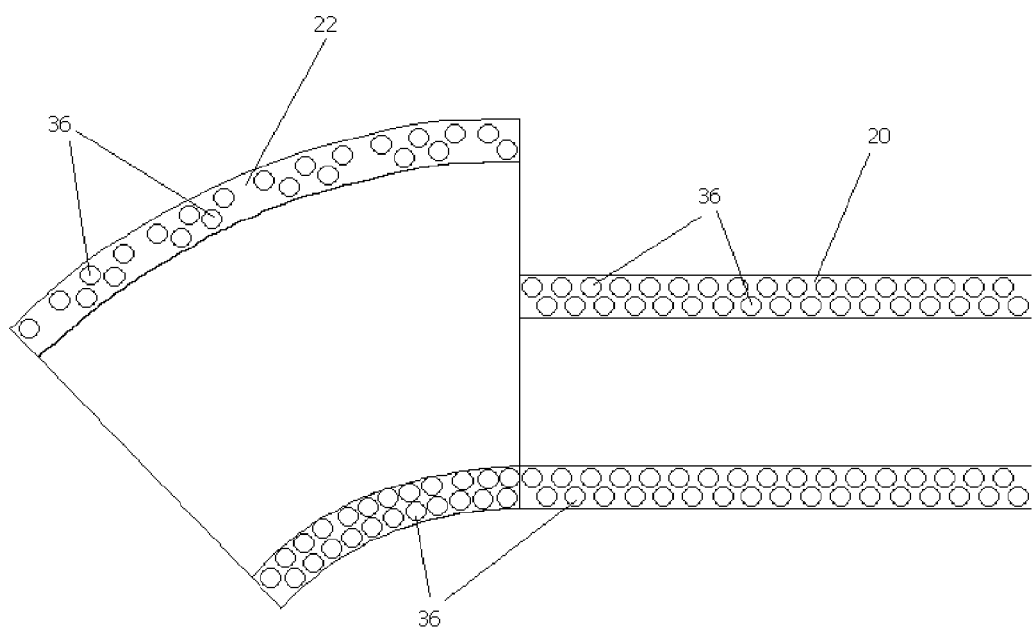
FIG. 13 is a schematic of a wire wound torroid and solenoid.
Figure 14:
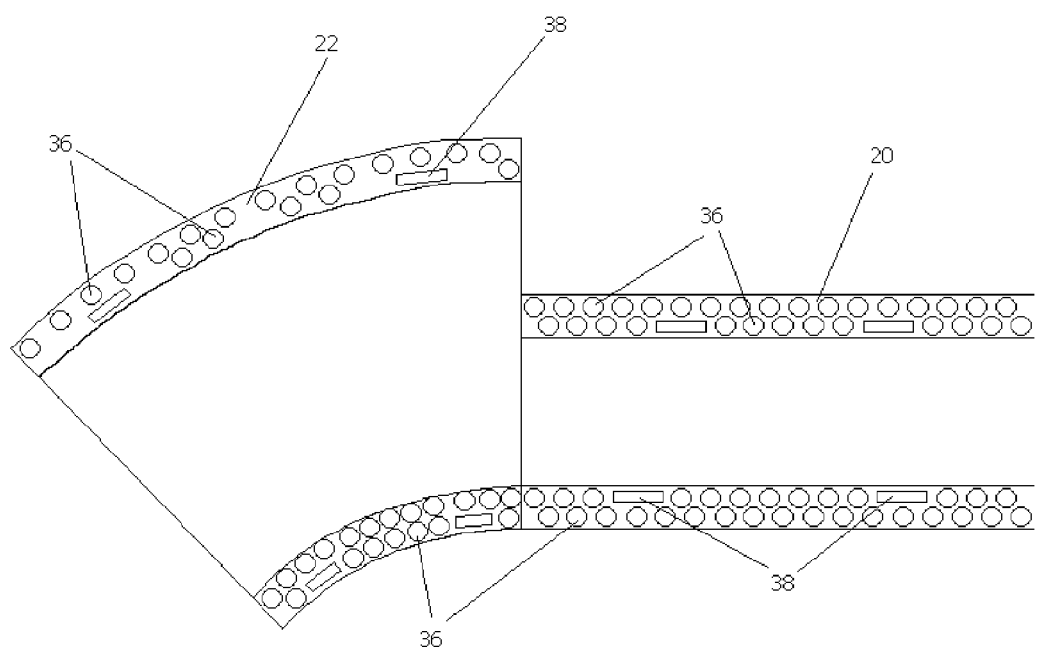
FIG. 14 is a schematic of a torroid and solenoid constructed with wire windings and permanent magnet material.

A first alternative electron cooling system 10a for increasing the phase space intensity and overall intensity of low energy ion beams is shown in FIG. 1, with a second alternative electron cooling system 10b shown in FIG. 2 and a third alternative electron cooling system 10c shown in FIG. 3. In order to clearly show the essentials of the invention, FIG. 1, FIG. 2 and FIG. 3 do not show high voltage feedthroughs, water feedthroughs, insulating stands and other such common necessary components. The electron cooling system 10a, b, c utilizes a combination of elements, including the electron supply device such as an electron cathode 12 for supplying a beam of electrons 14, a vacuum chamber 16 for containing particles, electrodes 18 to provide electric fields to accelerate or decelerate the electron 14 beam and which serve to trap neutralizing background-ions, solenoidal magnetic field devices 20 and torroidal magnetic field devices 22 to provide guiding and containing magnetic fields, an electron collector including a collection plate 24 having a material surface to collect the electrons 14 after they have performed their function, and ports 26 to allow beam ions 28 to enter and leave the electron cooling system 10. The solenoidal magnetic field devices 20 and torroidal magnetic field devices 22 may be constructed with wire 36 windings as shown in FIG. 13, or with a combination of wire 36 windings and permanent magnet 38 material as shown in FIG. 14.

The cathode 12 is essentially a hot surface from which electrons 14 are freed. By placing an electrode 18a in front of the cathode 12 an electric field is generated. The magnitude of the electric field near the cathode 12 is given by the expression:

$$E = V/x \qquad (1)$$

In equation (1), V is the potential difference between the cathode 12 and the electrode 18a and x is the distance between the electrode 18a and the cathode 12.

The amount of electron 14 beam current that is generated by an electron system comprised of an electron cathode 12 and a first electrode 18a is determined by the expression $$I = PV^{3/2} \tag{2}$$

In equation (2), V is the potential difference between the cathode 12 and the first electrode 18a and P is a constant, called the perveance, of the particular geometry employed in the system. In many applications, the desired electron 14 matching velocity is low, leading to a low value of voltage, V, which (by Equation 2) implies a low value of current, I. Hence, to obtain a high value of current, I, as well as to obtain a longitudinal trap for neutralizing background-ions, the electrode 18a will typically be biased at a potential greater than that of the downstream electrode 18b. (This is described in U.S. Pat. No. 7,501,640.) Electrode 18b is typically set at the potential of the vacuum chamber 16 beam pipe (which is typically ground potential).

In order to achieve electron 14 velocities appropriate for cooling, the electric potential surrounding the cooling region must be set to the appropriate value. The invention allows for separate potentials in each overlap region 30a,b by supplying separate electrodes 18 for each overlap region 30a,b. Electrode 18e provides the potential for the first overlap region 30a, which overlaps ions 28a. The electrons 14 are guided out of the first overlap region by a magnetic field created by the torroidal magnetic field device 22b. Rather than being collected, the electrons 14 are guided into a second overlap region 30b by the solenoidal magnetic field device 20c and torroidal magnetic field device 22c. Electrode 18j provides the potential for the second overlap region 30b, which overlaps ions 28b. Ions 28a may or may not be from the same ion beam storage system as ions 28b. By using one electrode 18e in a first overlap region 30a and a second electrode 18j in a second overlap region 30b, the electron 14 beam velocity can be adjusted to have the desired matching velocity in each overlap region 30a,b.

The electrons 14 are guided out of the second overlap region 30b by the torroidal magnetic field device 22d, and then pass through additional electrodes 18 and are ultimately collected in the collection plate 24. In order to provide longitudinal trapping for space charge neutralizing background-ions, the potential of electrode 18n is typically biased higher than the potential of electrode 18m. (See U.S. Pat. No. 7,501,640 encapable by reference.)

Desired end uses for the preferred embodiments include the cooling of ion 28 beams stored in a colliding beam dual storage ring system. Such a dual storage ring system can produce energy by way of fusion reactions and be used as a fusion energy power source.

Characteristically, the ion 28 beams used in fusion reactions will have an energy of between 20.0 keV and 5.0 MeV and the ions 28 used will be deuterium, tritium, and He-3 and other appropriate material. As a specific preferred embodiment, the deuterium ion 28 energy can be chosen as 247.2 keV and the tritium ion 28 energy chosen as 167.5 keV. For electron cooling to function, the velocity of the electron 14 beam must be equal to the velocity of the ion 28 beam, and for the case of a 247.2 keV deuterium ion 28 beam this means that the electron 14 beam has an energy of 67.3 eV. For the case of a 167.5 keV tritium ion 28 beam this means that the electron 14 beam has an energy of 30.5 eV.

Electron 14 transport will be accomplished by having the electrons 14 immersed in guide fields produced by solenoidal magnetic field devices 20 and torroidal magnetic field devices 22. The electrons 14 will leave the cathode 12 in this field, and execute helical motions around the guiding magnetic field lines. The orbital radius of these gyrations is determined from the Lorentz force equation, $evB = mv^2/r$, or, $$r = mv/eB. \tag{3}$$

Note that the velocity of Eq. (3) is the velocity perpendicular to the magnetic field lines, which is determined from the temperature of the cathode 12, which is typically about 0.1 eV. With $\frac{1}{2}mv^2 = 0.1$ eV, $v_{perp} = 1.88 \times 10^5$ m/s. The electrons 14 will tightly spiral around the field lines. For either the deuterium ion 28 or tritium ion 28 case, assuming a solenoidal or torroidal guide field of 100 Gauss, the gyro radius given by Eq. (3) is:

$$r_{gyro} = 0.107 \text{ mm}. \tag{4}$$

At low velocities, the electrons 14 will experience multiple scattering off of the residual background-ions trapped within the system. This multiple scattering will decrease the phase space density of the electron 14 beam, which will reduce the cooling effectiveness and can lead to electron 14 beam loss.

The angular growth a particle beam experiences as it passes through matter is given by:

$$\Delta <\phi^2> = 2\pi n (2Ze^2/Mv^2)^2 \ln(\theta_{max}/\theta_{min}) t. \tag{5}$$

In Eq. (5), n is the number density of neutralizing background-ions, Ze is the charge on the background-ions, e is the charge of the electron 14, M is the mass of the electrons 14, v is the velocity of the electrons 14 and t is the distance traveled by the electrons 14 through the background-ions. ($\theta_{min}$ and $\theta_{max}$ will be specified below.) The scattering particles are assumed to be singly charged background-ions, which leaves Z=1. Eq. (5) uses gaussian units. In these units $e^2/Mc^2 = r_e$, where $r_e$ is the classical radius of the electrons 14. Outside of the overlap regions 30a, b there is no ion 28 beam overlap, and the density of background-ions will be substantially equal to the electron 14 density (to achieve charge neutrality) and $n = n_e$. Thus, Eq. (5) can be rewritten as:

$$\Delta <\phi^2> = 2\pi n_e (2r_e/\beta^2)^2 \ln(\theta_{max}/\theta_{min}) t. \tag{6}$$

For the present situation with very low incident electron 14 energy, nuclear effects are unimportant and $\theta_{max} = 1$. The minimum scattering angle will be determined by the scattering angle associated with particles separated by the Debye screening distance, $\theta_{min} = 2k_D e^2/Mv^2 = 2k_D r_e/\beta^2$. ($\beta = v/c$ where c is the speed of light and $k_D = \omega_p/v$. $\omega_p^2 = 4\pi n e^2/M = 4\pi n c^2 r_e$.)

In the tritium ion 28 cooling section $k_D = \omega_p/v = 1.47 \times 10^{10}$ s$^{-1}$/$3.27 \times 10^6$ m/s = 4470 m$^{-1}$, so $\theta_{min} = 0.211$ µrad, and $\ln(1/\theta_{min}) = 15.4$. With $n_e = 6.74 \times 10^{16}$ m$^{-3}$, $r_e = 2.82 \times 10^{-15}$ m, $\beta = 1.09 \times 10^{-2}$, and t=0.10 m, $\Delta <\phi^2> = 0.00145$, and $\Delta \phi = 0.0381$.

As the electrons 14 leave the cathode 12 they have a transverse energy of about 0.1 eV. For the tritium ion 28 overlap case, this corresponds to a thermal angle of about 0.057 radians in the cooling straight. (The transverse thermal energy is equal to the beam energy times the square of the angle; $30.5$ eV$\times 0.057 \times 0.057$ is about 0.1 eV.) Hence, passage through a 10 cm drift of neutralizing background-ions will increase the thermal angle from 0.057 to $(0.057^2 + 0.0381^2)^{1/2} = 0.0686$. That is, passage through 10 cm of neutralizing background-ions will increase the electron 14 beam emittance by about 20%. Since the electron 14 cooling beam will be contained by magnetic fields, this should not be a problem. This does show however that drift lengths can not be too long. (The angular spread caused by scattering increases with the square root of distance t as given by Eq. (6).)

In the deuterium ion 28 cooling section $k_D=\omega_p/v=1.20\times 10^{10}$ $s^{-1}/4.87\times 10^6$ m/s=2470 $m^{-1}$, so $\theta_{min}=0.053$ μrad, and $\ln(1/\theta_{min})=16.8$. With $n_e=4.54\times 10^{16}$ $m^{-3}$, $r_e=2.82\times 10^{-15}$ m, $\beta=1.62\times 10^{-2}$, and t=0.10 m, $\Delta<\phi^2>=0.00022$, and $\Delta\phi=0.015$.

As the electrons 14 leave the cathode 12 they have a transverse energy of about 0.1 eV. For the deuterium ion 28 case, this corresponds to a thermal angle of about 0.0386 radians in the cooling straight. (The transverse thermal energy is equal to the beam energy times the square of the angle; 67.3 eV×0.0386×0.0386 is about 0.1 eV.) Hence, passage through a 10 cm drift of neutralizing background-ions will increase the thermal angle from 0.0386 to $(0.0386^2+0.015^2)^{1/2}=0.0414$. That is, passage through the neutralizing background-ions will increase the electron 14 beam emittance by about 7.3%. Since the electron 14 cooling beam will be contained by magnetic fields, this should not be a problem. This does show however that the drift length may not be too long.

It is important to note is that the multiple scattering growth equation scales as $n_e(1/\beta^2)^2$. Hence this effect decreases very rapidly with higher electron 14 velocity. Since $n_e$ also scales as $1/\beta$ the scattering scales as $1/\beta^5$. As an example, if the electron 14 beam is accelerated outside of the overlap region 30a,b from 30.5 V to 1030.5 V, the velocity will be increased from $3.27\times 10^6$ m/s to $1.90\times 10^7$ m/s, reducing the multiple scattering effect by a factor of $(1.90\times 10^7/3.27\times 10^6)^5=6622$. By advantageously biasing electrodes 18b and 18m (and, if needed, electrodes 18c, 18d, 18f, 18g, 18h, 18i, 18k, and 18l) at a potential much higher than the bias of electrodes 18e and 18j, the multiple scattering growth may be significant for that part of the electron 14 motion that occurs proximate to the electrodes 18e and 18j.

It is important to examine the role of trapped background-ions for the preferred embodiments shown in FIG. 2 and FIG. 3. (Due to its additional complexity, FIG. 1 is considered separately below.) In each case, electrode 18a is biased at a positive potential with respect to electrode 18b, and electrode 18n is biased at a positive potential with respect to electrode 18m, providing forces on the background-ions that force the background-ions back toward the overlap regions 30a,b. Hence, the background-ions are trapped between the ends of the system by the electric fields, and also trapped by the magnetic fields of the solenoidal magnetic field devices 20 and torroidal magnetic field devices 22.

Also important is the role of ion 28 beam space charge in providing a trap potential for background-ions in certain situations. Since electrodes 18b and 18m will typically be biased at the potential of the vacuum chamber 16 pipe, and since the overlap region 30a,b electrodes 18e and 18j (when either or both are utilized) are typically biased negatively with respect to the vacuum chamber 16 pipe, the background-ions will be accelerated into and through the overlap region 30a,b electrodes 18e and 18j (when either or both are utilized) until the ion 28 beams achieve space charge potentials greater than the electron 14 beam space charge potentials. (Since the electron 14 beam is moving at the same speed as the ion 28 beam in the overlap regions 30a,b, but faster elsewhere if either or both of electrodes 18e and 18j are utilized, if the ion 28 beam achieves an equal density to the electron 14 beam in the overlap region 30a,b, then the ion 28 beam density may exceed the electron 14 beam density outside of the overlap region 30a,b, and the space charge resulting from the beams outside of the overlap region 30a,b will be positive.) When the ion 28 beam current is high enough, in the regions where the ion 28 beams achieve space charge potentials greater than the electron 14 beam space charge potential, the neutralizing particles will be electrons within those regions and in those regions a positive space charge potential will exist that will serve to generate electric fields to trap the background-ions in the adjacent regions of the electron 14 beam transport. (Here, the adjacent region of electron 14 beam transport is that region within the electron 14 beam prior to the merge or after the separation. In the adjacent region, the electron 14 beam is neutralized by background-ions, and those background-ions will be reflected by the positive space charge in the merge region.)

Figure 4:
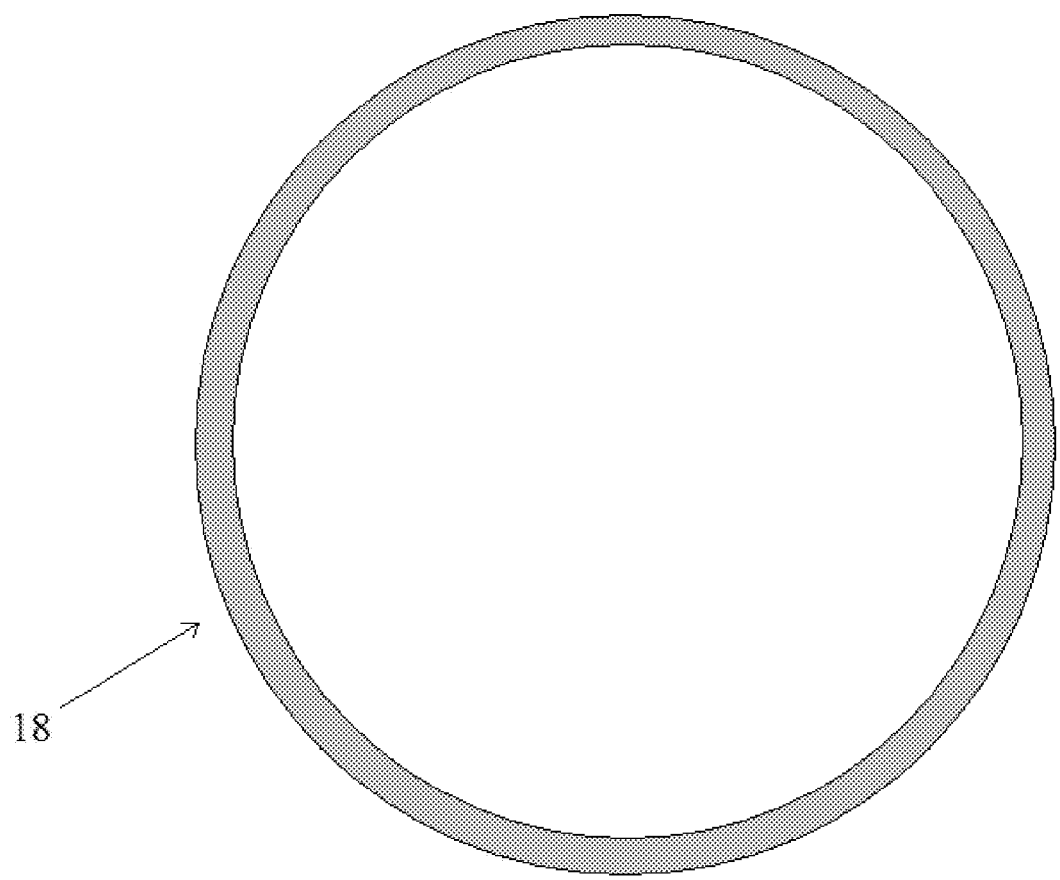
FIG. 4 is a schematic view of an electrode end involving an annular structure.
Figure 5:
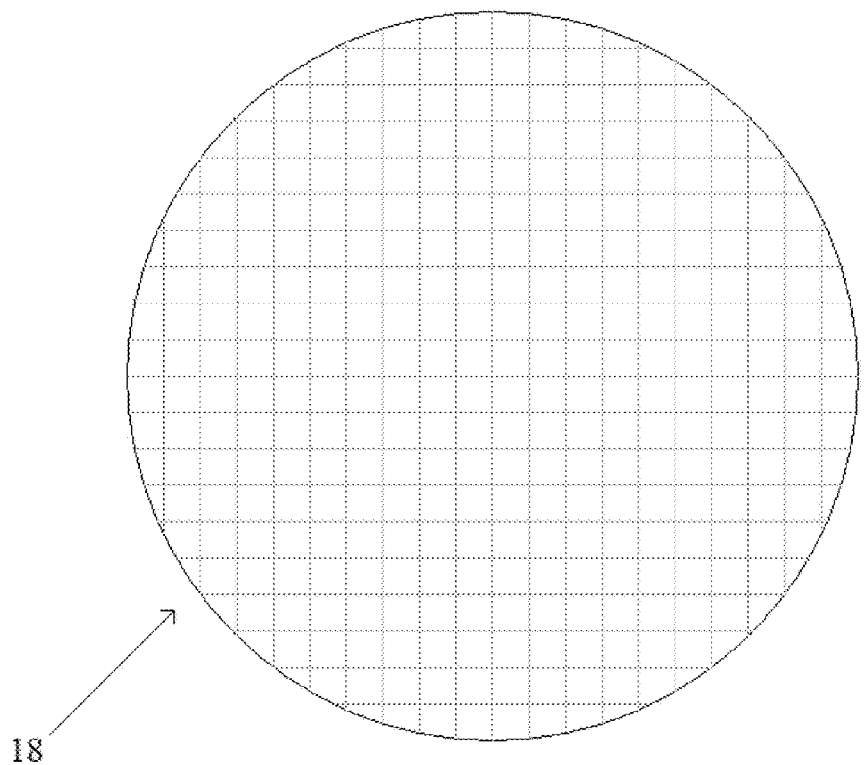
FIG. 5 is a schematic view of an electrode end involving a grid structure.

FIG. 4 and FIG. 5 show two possible structures for passing the electrons 14 and ions 28 out of the ends of the electrodes 18. FIG. 4 shows an annular structure, while FIG. 5 shows a grid structure. The grid structure allows for more precise control of the electric fields, while the annular structure allows for less beam loss due to electrons 14 or ions 28 hitting the structure as well as less growth in the angular spread of the electron 14 trajectories. (Insulating structures to isolate electrodes 18 from one another, and voltage feedthroughs to bias the electrodes 18 are not shown in any of the figures so as to keep the figures uncluttered. Insulating structures and voltage feedthroughs are common conventional components.) The function of the electron cooling system 10 is to correct velocity errors of stored ion 28 beams and it is desired to keep the ion 28 beam current as large as possible. Therefore, the ion 28 beams should pass through electrodes 18 with an annular structure in any preferred embodiment. But for electron 14 transport, there are various embodiments with advantages of each type of structure that will now be discussed.

Preferred Embodiment One—Using Grid Entry and Exit for the Overlap Region Electrodes A structure for the overlap region 30a,b electrodes 18e, 18j that achieves a grid entry and exit for the electrons 14 while achieving an annular entry and exit for the ions 28 is shown in the electron cooling system 10a in FIG. 1. In this embodiment, the electrode 18e and electrode 18j extend past the torroidal magnetic field devices 22 for both the electron 14 and ion 28 trajectories so that the electric fields are predominantly in the direction of motion of the electron 14 and ion 28 beams. Advantageously, electrode 18e depicted in FIG. 1 minimizes any electric fields perpendicular to the electron 14 motion by also including electrodes 18d and 18f close to the ends of electrode 18e. Advantageously, electrode 18j depicted in FIG. 1 minimizes any electric fields perpendicular to the electron 14 motion by also including electrodes 18i and 18k close to the ends of electrode 18j.

A first important consideration for the structure of FIG. 1 is the means to keep electric fields predominantly in the direction of electron 14 motion. This issue is important since electric fields perpendicular to the predominant electron 14 motion could, in principle, adversely affect the electron 14 trajectories so that they would no longer be useful in cooling. Substantial elimination of such fields can be arranged by using grids as shown in FIG. 5 to pass the electron 14 beam through the electrodes 18, and placing adjacent electrodes 18 of different bias in close proximity to each other. Such an arrangement will lead to electric fields predominantly along the direction of electron 14 motion.

For the ion 28 beams it is important that they not encounter grid structures, since such structures will result in beam loss. For the ion 28 beams, electric fields perpendicular to the predominant ion 28 motion are not a significant concern however, due to the much larger momentum of the ion 28 beams as compared to the electron 14 beam.

Figure 10:
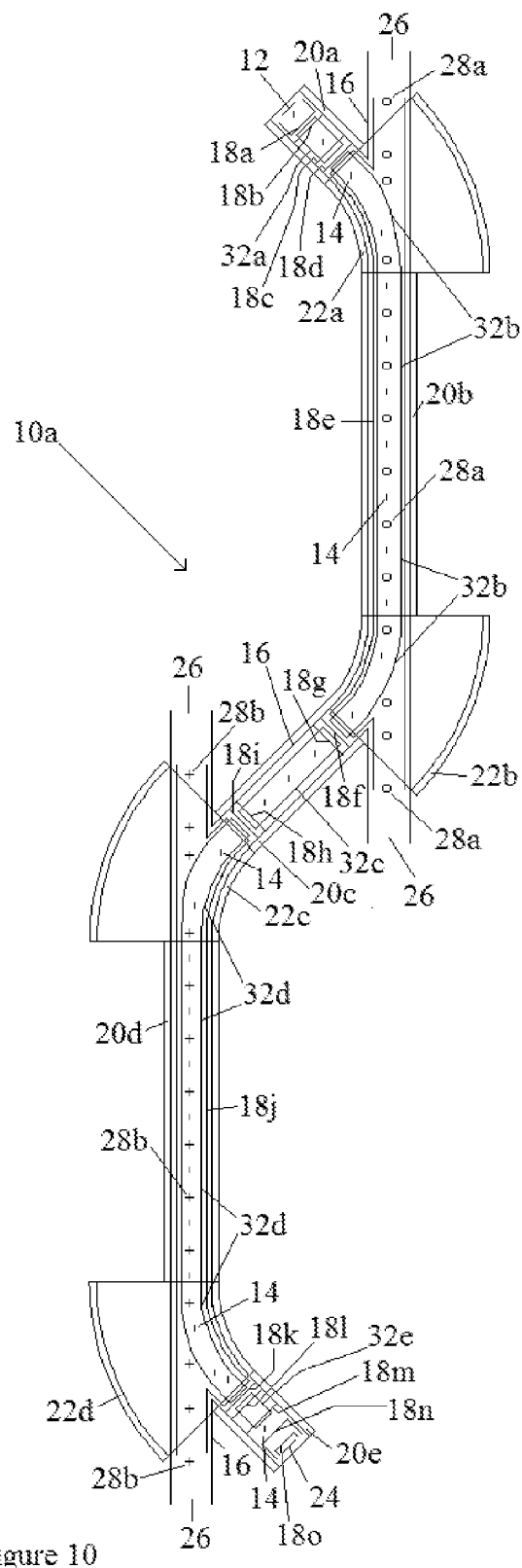
FIG. 10 is a schematic view of ion trap volumes that may be created in the first alternative system for use in the invention.
Figure 12:
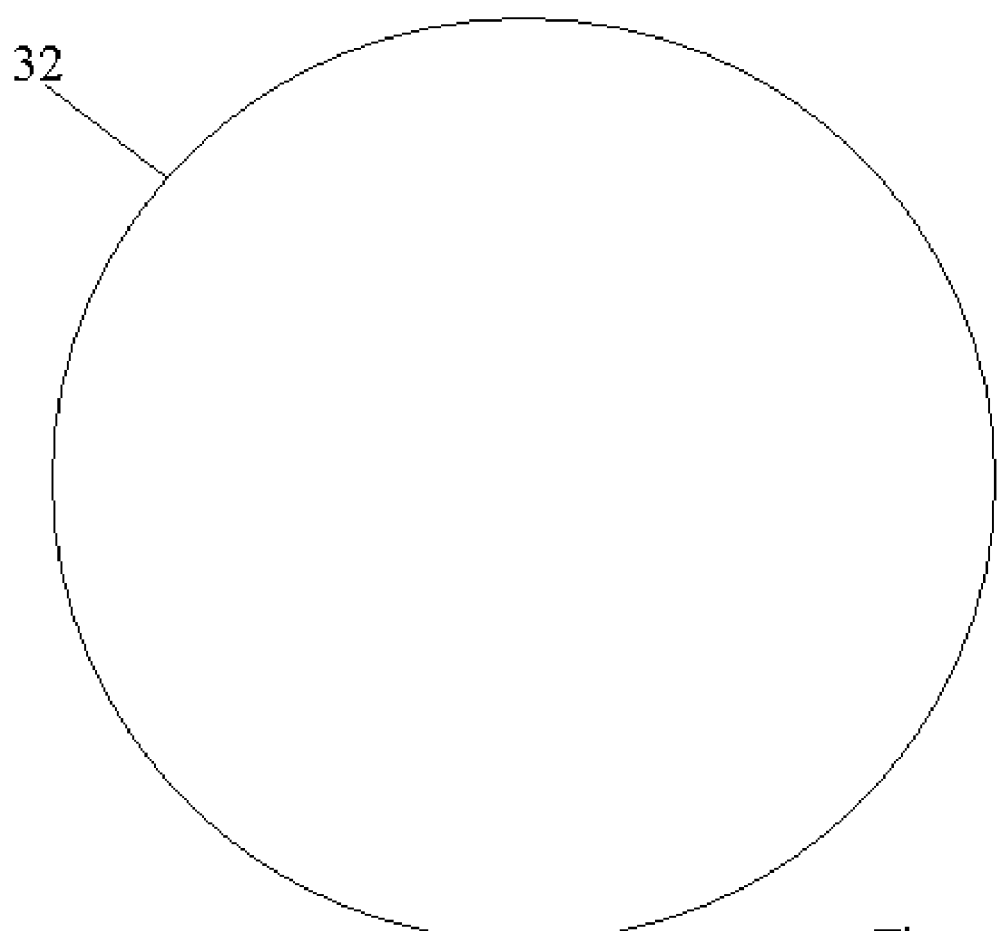
FIG. 12 is a schematic end view of an ion trap volume.

For the electron 14 beam unwanted fields could come from the self space charge of the electron 14 beam, and therefore it is important to neutralize the electron 14 space charge by trapping background-ions in various places within the system. The trapped background-ions may exist within a trap volume 32. Background-ions are trapped in the dimensions transverse to electron 14 motion by the magnetic fields generated by the solenoidal magnetic field devices 20 and torroidal magnetic field devices 22. FIG. 12 shows an end view, and FIG. 10 shows a side view of the trap volumes 32 that result from the electrodes 18 and the solenoidal and torroidal fields for preferred embodiment one. Background-ions are trapped in the dimension parallel to electron 14 motion by biasing electrodes 18 to supply containing electric fields. Biasing electrode 18a higher than electrode 18b, and biasing electrode 18d higher than electrode 18c provides the longitudinal trapping for the trap volume 32a for the region between electrode 18b and electrode 18c. Biasing electrode 18d higher than electrode 18e, and biasing electrode 18f higher than electrode 18e provides the longitudinal trapping for the trap volume 32b for the region within electrode 18e. Biasing electrode 18f higher than electrode 18g, and biasing electrode 18i higher than electrode 18h provides the longitudinal trapping for the trap volume 32c for the region between electrode 18g and electrode 18h. Biasing electrode 18i higher than electrode 18j, and biasing electrode 18k higher than electrode 18j provides the longitudinal trapping for the trap volume 32d for the region within electrode 18j. Biasing electrode 18k higher than electrode 18l, and biasing electrode 18n higher than electrode 18m provides the longitudinal trapping for the trap volume 32e for the region between electrode 18l and electrode 18m. With all of these biases, the only place the electron 14 beam will not be neutralized by background-ions is in regions of acceleration that are close to electrode 18 structures, and in those regions the electrode 18 structures themselves ensure that the transverse electric fields are small.

A second important consideration for the structure of FIG. 1 is the allowable hole size for the grids. An estimate of the allowable hole size starts with the charge per unit meter within the hole. For an electron 14 beam $\lambda=I/v$, where $\lambda$ is the charge per unit meter, I is the electron 14 beam current and v is the velocity of the electrons 14. For the case of tritium ion 28 beam cooling, $v=3.27\times10^6$ m/s, and with I=10,000 A this leaves $\lambda=3.065\times10^{-3}$ C/m, and, with a beam radius of r=30 cm, this leaves a charge per unit volume of $\rho=\lambda/\pi r^2=0.0108$ C/m$^3$. If the spacing of the wires is 400 microns, a good estimate of the self space charge depression is given by use of Gauss's Law $\int \epsilon_0 E(dA)=q_{in}$. (Here, $\epsilon_0=8.85\times10^{-12}$ C$^2$/Nm$^2$, E is the electric field, dA is the differential area and $q_{in}$ is the charge within the volume surrounded by the area of integration.) Within a sphere of charge of radius r this becomes $\epsilon_0 E 4\pi r^2=(4/3)\pi r^3 \rho$, or, $E=(\rho/3\epsilon_0)r$, and the self potential is $V=\int E dr=(\rho/6\epsilon_0)r^2$. With r=0.2 mm this leaves a self potential of $$V=(0.0108 \text{ C/m}^3)(2\times10^{-4}\text{m})^2/6(8.85\times10^{-12}\text{C}^2/\text{Nm}^2)= 8.14 \text{ V}. \quad (7)$$

Equation 7 is an approximate upper limit of an acceptable voltage depression, since the electron 14 energy for cooling the tritium ions 28 is 30.5 V. However, it is important to include the fact that the electron 14 beam may be substantially neutralized by trapped background-ions on one side of the grid. This neutralization will allow a larger hole size, and therefore hole sizes in the neighborhood of a few to several millimeters are appropriate.

Grid bar sizes of a few to several microns are presently state of the art, and hence electron 14 beam losses of about one part in a thousand would result from electron 14 beam interception on the grid. This electron 14 loss also will lead to grid damage over time, requiring periodic replacement of the grids. Lastly, use of grid entry and exit structures require that the electrodes 18e and 18j extend through the torroidal magnetic field device 22 regions, and in the torroidal magnetic field device 22 regions the electron 14 beam will have low velocity and undergo multiple scattering off of trapped background-ions where it does not overlap the ion 28 beams.

In summary, using grid entrance and exit structures for the electrodes 18e and 18j as shown in FIG. 1 has the disadvantages of additional multiple scattering emittance growth of the electron 14 beam within electrodes 18e and 18j, some small electron 14 beam loss to the grids, as well as the need for periodic replacement of the grids. The advantage of the grid entrance and exit structure is the lack of significant electric fields perpendicular to the electron 14 motion.

Figure 11:
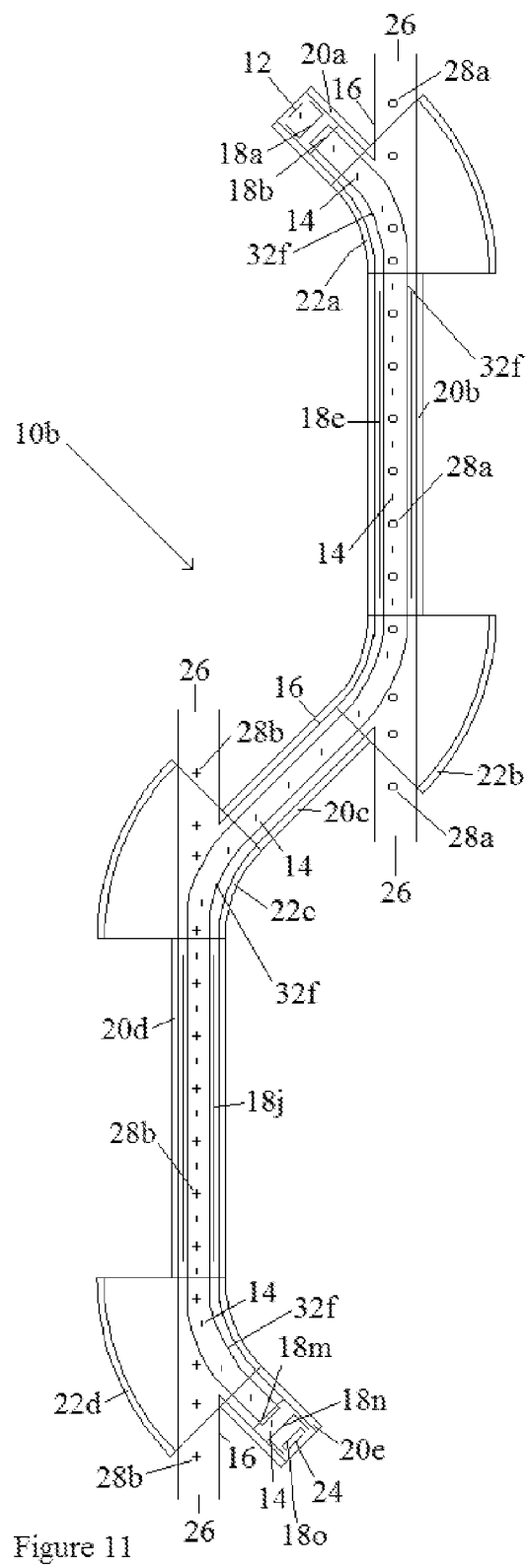
FIG. 11 is a schematic view of the ion trap volume that may be created in the second alternative system for use in the invention.

Preferred Embodiment Two—Using Annular Entry and Exit for the Overlap Region Electrodes A structure for the overlap region 30a,b electrodes 18e and 18j that achieves an annular entry and exit for the electrons 14 and the ions 28 is shown in the electron cooling system 10b in FIG. 2. In this embodiment, the electrode 18e and electrode 18j do not extend into the torroidal magnetic field devices 22. At maximum stored ion 28 currents, the electron 14 and ion 28 currents will be approximately equal and in that situation the two beams simply coast along together with the ions 28 losing their velocity errors to the electrons 14, and there are few residual background-ions in the system. Advantageously, this situation will result in very little multiple scattering transverse velocity growth in the electron 14 beam in the overlap region 30a,b of the invention configuration shown in FIG. 2. However, in the portion of the electron cooling system 10b where the electrons 14 merge and separate from the ion 28 beams there will be some multiple scattering growth from the electrons 14 colliding with the ion 28 beams. Yet, advantageously, by biasing the vacuum chamber 16 pipe to the same potential as electrodes 18b and 18m, and biasing electrodes 18e and 18j to a much lower potential than the vacuum chamber 16 pipe, the velocity of the electrons 14 will be large except in the overlap regions 30a, b. Hence, the configuration shown in FIG. 2 has the advantage of less transverse velocity growth due to multiple scattering. The configuration shown in FIG. 2 has the further advantage of far fewer grid apertures than the configuration shown in FIG. 1. For very low velocity electrons 14, background-ions may be trapped within a trap volume 32 to neutralize the electron 14 space charge. Solenoidal and torroidal fields, produced by the solenoidal magnetic field devices 20 and torroidal magnetic field devices 22 provide the transverse trapping. An end view of the trap volume 32 is shown in FIG. 12. In this case appropriate biasing of electrodes 18a, 18b, 18m and 18n can lead to the formation of the longitudinal fields needed to provide the longitudinal trapping in a trap volume 32f that extends throughout much of the system, as shown in FIG. 11.

Figure 6:
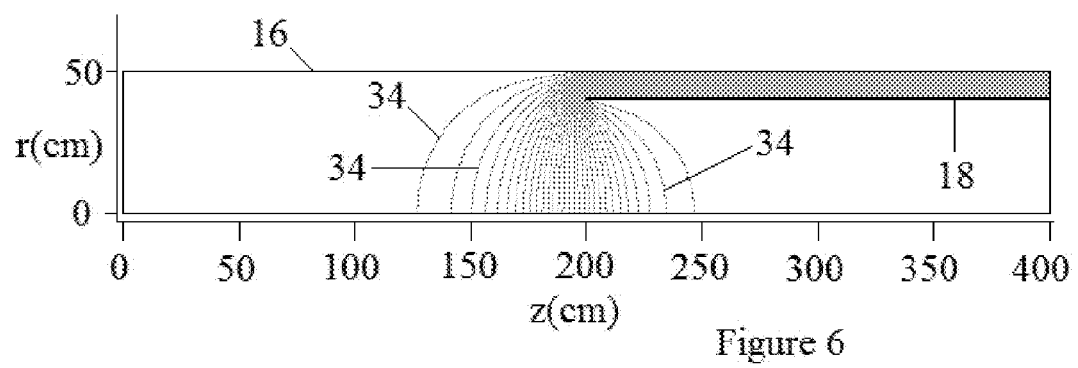
FIG. 6 is a plot of electrostatic potentials in a portion of the overlap region of FIG. 2 assuming a 1000 V potential difference between the vacuum pipe and the electrode proximate to the overlap region.
Figure 7:
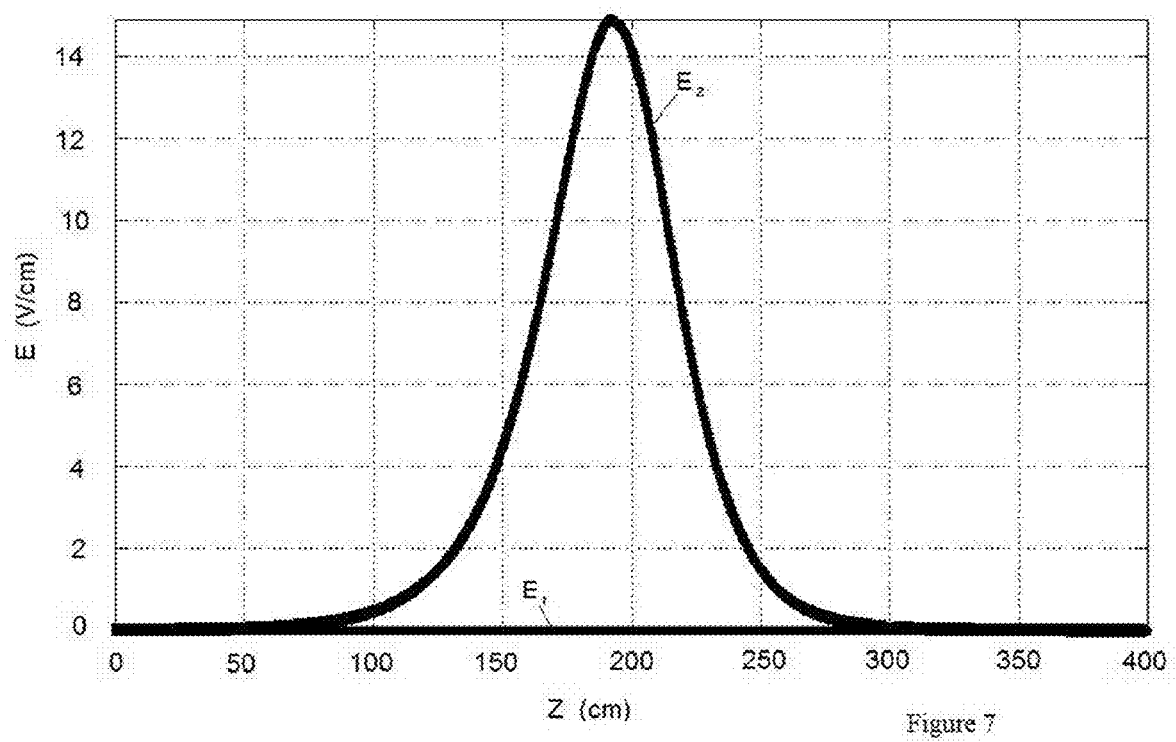
FIG. 7 is a plot of the electric fields on the central axis of a portion of the overlap region of FIG. 2 assuming a 1000 V potential difference between the vacuum pipe and the electrode proximate to the overlap region.
Figure 8:
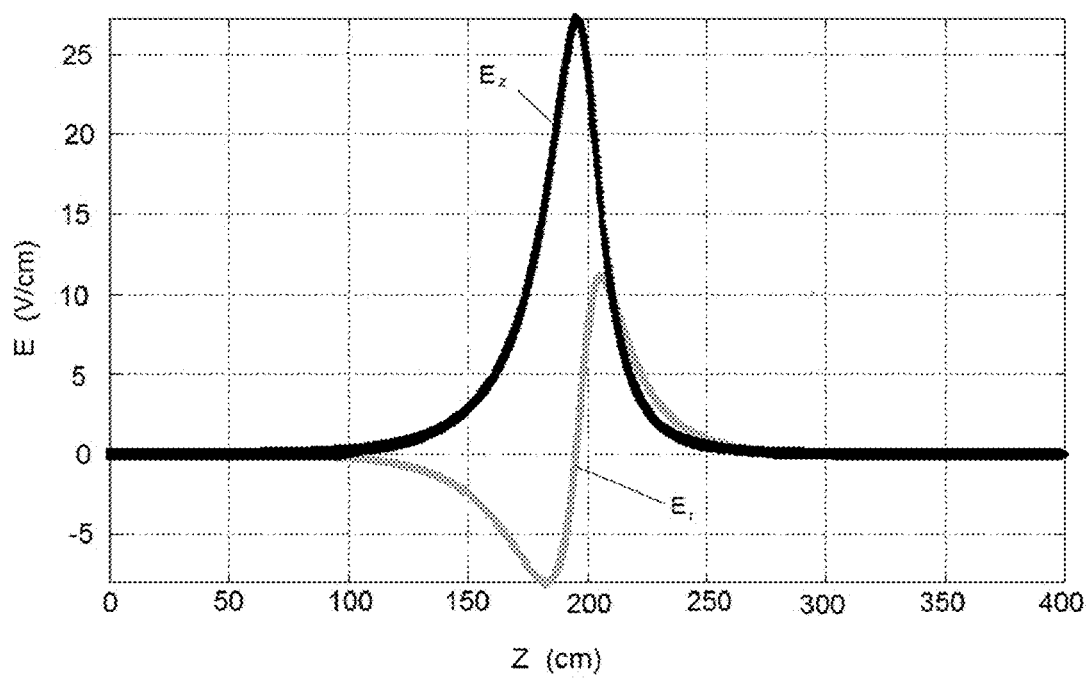
FIG. 8 is a plot of the electric fields parallel to and 30 cm from the central axis of a portion of the overlap region of FIG. 2 assuming a 1000 V potential difference between the vacuum pipe and the electrode proximate to the overlap region.
Figure 9:
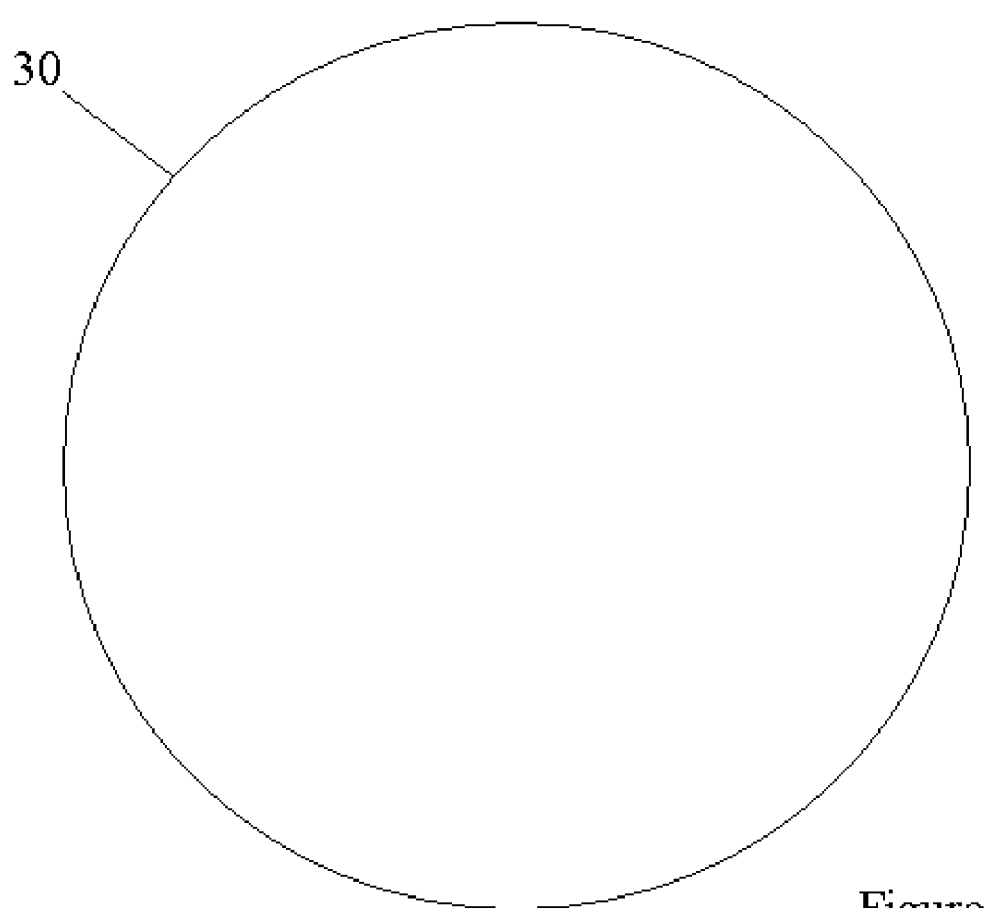
FIG. 9 is a schematic end view of an overlap region.

However, the configuration shown in FIG. 2 does lead to electric fields that are not in the direction of electron 14 motion, and it also leads to electric fields that extend over a substantial length prior to and past the annular apertures of electrodes 18e and 18j. A study has been done for the case of an electrode 18 with inner diameter of 80 cm surrounded by a 1 meter inner diameter vacuum chamber 16 pipe, with a potential difference of 1000 V between the electrode 18 and vacuum chamber 16 pipe. The study was done with the POISSON computer code from Los Alamos Laboratory. The results of the study are shown in FIG. 6, FIG. 7, and FIG. 8. FIG. 6 shows the electrostatic equipotentials 34 generated by biasing the electrode 18 at −1000 V with respect to the vacuum chamber 16 pipe. As can be seen, the fields on the axis extend over a meter in length, and there is a significant radial component to the off axis fields.

A first issue concerns the longitudinal extent of the electric fields. FIG. 7 shows the longitudinal electric field $E_z$ and the transverse electric field $E_r$ as a function of longitudinal position along the axis of the electrode 18 and the vacuum chamber 16 pipe as calculated by POISSON. The POISSON study shows that the longitudinal electric field $E_z$ will exceed 0.1 V/m for 3.8 meters along the axis. Hence, it will take 7.6 meters of extra overlap region 30a,b length (as compared to the embodiment of FIG. 1) for the electron 14 beam to be fully decelerated to the desired low velocity and then fully accelerated back to vacuum chamber 16 pipe potential. The larger size will require additional materials for construction, and more power needed for the solenoidal magnetic field devices 20b and 20d. Or, operation of a shorter device will involve some velocity spread in a greater proportion of the electron 14 beam.

A second issue concerns the effect of the transverse electric fields. FIG. 8 shows the longitudinal electric field $E_z$ and the transverse electric field $E_r$ as a function of longitudinal position along a line 30 cm distant and parallel to the axis of electrode 18 and the vacuum chamber 16 pipe. Since the electrons 14 are spiraling around the magnetic field lines, the first quantity to check is to see if the solenoidal magnetic force will be overcome by the radial electric force. The magnetic force is e(v×B). The smallest magnetic force will be with the lowest velocity (that of the tritium ion 28 overlap region) of v=3.27×10$^6$ m/s and with B=100 G=0.01 T, the magnetic force on the particle will be 3.27×10$^4$ eV/m. As seen from FIG. 8, the maximum transverse electric field $E_r$ is 11 V/cm, or 1.1×10$^3$ V/m leading to an electric force of 1.1×10$^3$ eV/m. Hence the weakest magnetic force is approximately 30 times greater than the strongest electric force, and therefore the electrons 14 will stay tightly bound in their helical motions. The second quantity to check is whether the electrons 14 will pick up significant transverse momentum from the transverse fields. The electrons 14 will be accelerated by the transverse field on one half of their spiraling motion and decelerated on the other half. If the electric field was constant this would lead to a harmless E×B drift. What is of concern is the fact that the electric field is changing, and hence the accelerating portion may be larger than the decelerating portion. The transverse electric field $E_r$ has a peak value of about 11 V/cm and then drops to a value of about −8 V/cm for the case shown in FIG. 8, and this occurs over a length of about 23 cm approximately centered at the aperture of the electrode 18. Therefore the transverse electric field $E_r$ changes by (19 V/cm)/(23 cm)=0.826 V/cm$^2$ in the central region. The longitudinal velocity in the central region will be determined by the potential there which is about 500V (where half of the deceleration is complete), and in the tritium ion 28 case the electron 14 energy is 530.5 eV implying a velocity of 1.37×10$^7$ m/s, which is 72.7 times greater than the transverse velocity. Therefore, the electron 14 will go 72.7 times further longitudinally than it does transversely, and since it executes a near circular motion of $2\pi r_{gyro}$=0.672 mm in one gyration it will go approximately 4.88 cm longitudinally during one gyration. Considering an electron 14 that is accelerated transversely during the first half of the gyration and decelerated on the second half, the average field over these half gyrations will change by 0.826 V/cm$^2$×2.44 cm=2.02 V/cm. If we now consider the case where an electron 14 gets 0 deceleration and 2.02 V/cm acceleration and note that it traverses a transverse distance of $2r_{gyro}$=0.0214 cm during one half gyration, then this electron 14 would increase its transverse energy by 2.02 eV/cm×0.0214 cm=4.32×10$^{-2}$ eV during this single gyration. Over the 23 cm region wherein the transverse electric field is changing strongly there will be approximately (23 cm/4.88 cm)=4.71 gyrations, and if all of the increases add together, the transverse electron 14 energy would increase by 0.2 eV. While such an increase would still allow cooling to occur, it could limit the number of straight sections that a single electron 14 beam can cool. Note that the calculation presented here is intended to estimate the magnitude of the effect for those electrons 14 near the edge of the electron 14 cooling beam. Toward the center of the beam the effect lessens, with zero effect in the beam center. The calculation indicates the essential feasibility of using an annular entrance for the overlap electrodes 18e and 18j.

In summary, using annular entrance and exit structures for the electrodes 18e and 18j as shown in FIG. 2 has the advantages of minimum multiple scattering emittance growth of the electron 14 beam, less electron 14 beam loss due to fewer grid apertures in the system, and fewer grids that would need periodic replacement. The disadvantage of the annular entrance and exit structure is the presence of significant transverse electric fields $E_r$ perpendicular to the electron 14 motion as well as longitudinal electric fields $E_z$ that will lead to an electron 14 velocity spread within the electron 14 beam which may require additional length for the cooling overlap region 30a,b.

Other Preferred Embodiments—Using the Vacuum Pipe for One or More Overlap Region Electrodes A structure for the overlap region 30a,b where electrodes 18e and 18j are part of the vacuum chamber 16 pipe is shown in the electron cooling system 10c in FIG. 3. In this embodiment, the electrode 18e and electrode 18j are not separate electrodes at all, but rather, they are just a region of the vacuum chamber 16 pipe. Advantageously, this embodiment uses allows a single electron 14 beam to cool ions 28 in more than one overlap region 30a,b. In this embodiment, the overlap electrodes 18e and 18j are set to the same potential as electrodes 18b and 18m. This embodiment of the invention will be of use when there is no significant transverse growth of the electron 14 beam due to multiple scattering (at electron 14 energies above approximately 200 eV) and when the velocity of the ion 28a beam in the first overlap region 30a is the same as the velocity of the ion 28b beam in the second overlap region 30b.

This embodiment can be modified by including a separate electrode 18e in the first overlap region 30a or a separate electrode 18j in the second overlap region 30b should the velocity of the ion 28a beam in the first overlap region 30a be different from the velocity of the ion 28b beam in the second overlap region 30b.

In summary, using the vacuum chamber 16 beam pipe as either or both of the electrodes 18e and 18j has the disadvantage of additional multiple scattering emittance growth of the electron 14 beam throughout the system. The advantages of using the vacuum chamber 16 beam pipe instead of either or both of electrodes 18e and 18j are less electron 14 beam loss due to fewer grid apertures in the system, fewer grids that would need periodic replacement, and no significant electric fields perpendicular to the electron 14 motion.

What is claimed is:

1. An electron beam and ion beam system including an electron beam, a first ion beam, and a second ion beam, comprising:
   a vacuum chamber to allow passage, merging and separation of said electron beam and said first ion beam including a first overlap region wherein said electron beam and said first ion beam are overlapped, and to allow passage, merging and separation of said electron beam and said second ion beam including a second overlap region wherein said electron beam and said second ion beam are overlapped;
   an electron supply device including a cathode to produce said electron beam;
   an electron collector including a collection plate to collect said electron beam;
   a first electrode located proximate to said first overlap region and biased at a potential to set the velocity of said electron beam to the desired velocity of said first ion beam;
   a second electrode located proximate to said second overlap region and biased at a potential to set the velocity of said electron beam to the desired velocity of said second ion beam;
   a first magnetic field production device to create magnetic fields to guide said electron beam along a desired path, merge and separate said electron beam and said first ion beam;
   a second magnetic field production device to create magnetic fields to guide said electron beam along a desired path, merge and separate said electron beam and said second ion beam.

2. A system in accordance with claim 1, wherein at least one of said first electrode or said second electrode includes a substantially central opening to allow passage of said electron beam and to allow passage of at least one of said first ion beam or said second ion beam.

3. A system in accordance with claim 1, wherein at least one of said first electrode or said second electrode includes a grid conducting structure to allow passage of said electron beam and a separate substantially central opening to allow passage of at least one of said first ion beam or said second ion beam.

4. A system in accordance with claim 1, wherein at least one of said first electrode or said second electrode is said vacuum chamber.

5. A system in accordance with claim 1, wherein at least one of said first magnetic field production device or said second magnetic field production device includes solenoidal and torroidal wire windings with electric current flowing through the wires.

6. A system in accordance with claim 1, wherein at least one of said first magnetic field production device or said second magnetic field production device includes solenoidal and torroidal wire windings with electric current flowing through the wires and permanent magnet material.

7. A system in accordance with claim 1, wherein said first ion beam is the same beam as said second ion beam.

8. A system in accordance with claim 1, wherein said first ion beam is a different beam than said second ion beam.

9. A method of cooling a first ion beam and a second ion beam with an electron beam comprising the steps of:
   operating a vacuum chamber to allow passage, merging and separation of said electron beam and said first ion beam including a first overlap region wherein said electron beam and said first ion beam are overlapped, and to allow passage, merging and separation of said electron beam and said second ion beam including a second overlap region wherein said electron beam and said second ion beam are overlapped;
   operating an electron supply device including a cathode to produce said electron beam;
   operating an electron collector including a collection plate to collect said electron beam;
   operating a first electrode located proximate to said first overlap region and biased at a potential to set the velocity of said electron beam to the desired velocity of said first ion beam;
   operating a second electrode located proximate to said second overlap region and biased at a potential to set the velocity of said electron beam to the desired velocity of said second ion beam;
   operating a first magnetic field production device to create magnetic fields to guide said electron beam along a desired path, merge and separate said electron beam and said first ion beam;
   operating a second magnetic field production device to create magnetic fields to guide said electron beam along a desired path, merge and separate said electron beam and said second ion beam.

10. A method in accordance with claim 9, wherein at least one of said first electrode or said second electrode includes a substantially central opening to allow passage of said electron beam and to allow passage of at least one of said first ion beam or said second ion beam.

11. A method in accordance with claim 9, wherein at least one of said first electrode or said second electrode includes a grid conducting structure to allow passage of said electron beam and a separate substantially central opening to allow passage of at least one of said first ion beam or said second ion beam.

12. A method in accordance with claim 9, wherein at least one of said first electrode or said second electrode is said vacuum chamber.

13. A method in accordance with claim 9, wherein at least one of said first magnetic field production device or said second magnetic field production device includes solenoidal and torroidal wire windings with electric current flowing through the wires.

14. A method in accordance with claim 9, wherein at least one of said first magnetic field production device or said second magnetic field production device includes solenoidal and torroidal wire windings with electric current flowing through the wires and permanent magnet material.

15. A method in accordance with claim 9, wherein said first ion beam is the same beam as said second ion beam.

16. A method in accordance with claim 9, wherein said first ion beam is a different beam than said second ion beam.

* * * * *